US012085593B2

(12) United States Patent
Djelassi-Tscheck et al.

(10) Patent No.: US 12,085,593 B2
(45) Date of Patent: Sep. 10, 2024

(54) CURRENT MEASUREMENT CIRCUIT WITH MULTIPLE OPERATION MODES

(71) Applicant: Infineon Technologies AG, Neubiberg (DE)

(72) Inventors: Christian Djelassi-Tscheck, Villach (AT); Alexander Mayer, Treffen (AT); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 18/058,858

(22) Filed: Nov. 25, 2022

(65) Prior Publication Data
US 2023/0184817 A1    Jun. 15, 2023

(30) Foreign Application Priority Data
Dec. 9, 2021    (DE) .......................... 102021132537.4

(51) Int. Cl.
*G01R 19/25*    (2006.01)
*G01R 35/00*    (2006.01)

(52) U.S. Cl.
CPC ........... *G01R 19/25* (2013.01); *G01R 35/005* (2013.01)

(58) Field of Classification Search
CPC .............. G01R 19/0092; G01R 21/133; G01R 35/005; G01R 31/3842; G01R 19/25; G01R 31/3648; G01R 22/10; G01R 15/146; G01R 21/06; G01R 19/165; G01R 15/08; G01R 31/3004; G01R 22/068; G01R 19/1659; G01R 1/206; G01R 19/15; G01R 19/12; G01R 15/00
See application file for complete search history.

(56) References Cited

U.S. PATENT DOCUMENTS

| 8,344,722 | B2* | 1/2013 | Harper | G01R 19/0092 |
| | | | | 324/240 |
| 8,582,266 | B2* | 11/2013 | Bertin | G01R 35/005 |
| | | | | 361/93.8 |
| 8,648,586 | B2* | 2/2014 | Singh | G05F 1/573 |
| | | | | 323/315 |
| 9,594,097 | B2* | 3/2017 | Bogner | G01R 1/20 |

(Continued)

FOREIGN PATENT DOCUMENTS

| DE | 102012209499 A1 | 12/2012 |
| DE | 112018005096 T5 | 8/2020 |
| DE | 102020131640 A1 | 12/2021 |

*Primary Examiner* — Vinh P Nguyen
(74) *Attorney, Agent, or Firm* — Shumaker & Sieffert, P.A.

(57) ABSTRACT

A circuit may include a load transistor and a current measuring circuit that is coupled to the load transistor. The load transistor has a main current path, which is connected between a first supply node and an output pin for connecting a load. The current measuring circuit has a sense transistor coupled to the load transistor. The current measuring circuit is designed to deliver a measuring current that represents a load current flowing through the load transistor. The circuit may also include an analog-to-digital converter with a current input, and a digital-to-analog converter. The analog-to-digital converter is designed to output a digital signal representing an input current of the analog-to-digital converter. The digital-to-analog converter is designed to output an output current that depends on the digital signal. A control circuit is designed to output the measuring current.

12 Claims, 3 Drawing Sheets

(56) References Cited

U.S. PATENT DOCUMENTS

| | | | |
|---|---|---|---|
| 11,569,811 B2* | 1/2023 | Mayer | G01R 19/2513 |
| 11,650,233 B2* | 5/2023 | Bhargava | H02M 3/157 |
| | | | 324/120 |
| 2021/0389353 A1 | 12/2021 | Bhargava et al. | |
| 2023/0194595 A1* | 6/2023 | Djelassi-Tscheck | ........................ |
| | | | G01R 31/2879 |
| | | | 324/762.01 |

* cited by examiner

CURRENT MEASUREMENT CIRCUIT WITH MULTIPLE OPERATION MODES

This Application claims priority to German Application Number 102021132537.4, filed on Dec. 9, 2021, the entire content of which is incorporated herein by reference.

TECHNICAL FIELD

This description applies to a current measuring circuit, in particular a so-called sense transistor circuit, which is also suitable for measuring very small currents.

BACKGROUND

An approach to current measurement often used in conjunction with power transistors is the use of a so-called sense transistor. A power transistor (e.g. a DMOS transistor) usually consists of a plurality of transistor cells connected in parallel (transistor cell array). However, a small number of transistor cells of the cell array form a separate transistor (the sense transistor). This sense transistor is operated at the same operating point as the power transistor, but has a significantly smaller active surface area than the power transistor. The currents flowing through the power transistor and the sense transistor are roughly proportional in such an arrangement, wherein the proportionality factor K (at least theoretically) corresponds to the ratio of the active surface areas of the two transistors. This means that the active surface area of the sense transistor is less than the active surface area of the power transistor by a factor K.

The proportionality factor K can assume values greater than 10,000 in practical applications. If K=10,000, a load current through the power transistor of 10A would result in a measuring current of 1 mA. In many applications, however, the electrical loads switched by the power transistor have an energy-saving mode (low power mode, power down mode, idle mode, etc.), in which the current consumption is very low. If, for example, the current flowing through the power transistor is only 1 mA, then with K=10,000, the measuring current would only be around 100 nA.

It has been shown that the proportionality factor K is not constant, but in fact deviates from its nominal value at very low currents, which results in corresponding measurement errors. One cause of this effect is the very small voltage drop across the power transistor. For this reason, a controller may be provided that, with a low drain-source voltage on the power transistor, reduces its gate voltage to increase the on resistance, which allows a more accurate current measurement with the sense transistor.

However, in the event of an abrupt rise in the load current, the controller is not able to increase the gate voltage again fast enough, and therefore transient voltage dropouts can occur at the load due to the increased on resistance.

The inventors have addressed the object of developing an improved current measurement circuit that avoids or at least mitigates the problems described above at very low currents.

SUMMARY

The stated object is achieved by means of the circuit according to claim 1. Preferred exemplary embodiments and further developments are the subject matter of the dependent claims.

In the following, a circuit designed for current measurement is described. According to one exemplary embodiment, the circuit comprises a load transistor and a current measuring circuit that is coupled to the load transistor. The load transistor has a main current path, which is connected between a first supply node and an output pin for connecting a load. The current measuring circuit has a sense transistor coupled to the load transistor. The current measuring circuit is designed to deliver a measuring current that represents a load current flowing through the load transistor. The circuit also comprises an analog-to-digital converter with a current input, and a digital-to-analog converter. The analog-to-digital converter is designed to output a digital signal representing an input current of the analog-to-digital converter. The digital-to-analog converter is designed to output an output current that depends on the digital signal. A control circuit is designed to output the measuring current at a sense pin by means of switches in a first mode, and in a second mode to supply the measuring current as input current to the analog-to-digital converter and to output the output current of the digital-to-analog converter at the sense pin.

A corresponding method for current measurement is also described. According to one exemplary embodiment, the method comprises providing a measuring current by means of a current measuring circuit that has a sense transistor coupled to a load transistor, and outputting the measuring current at a sense pin in a first mode of an integrated circuit that contains the load transistor and the sense transistor. The method also comprises generating a digital value that represents the measuring current in a second mode of the integrated circuit, and generating an output current depending on the digital value. This output current is output at the sense pin in the second mode of the integrated circuit.

BRIEF DESCRIPTION OF THE FIGURES

In the following text, exemplary embodiments are described based on illustrations. The illustrations are not necessarily true to scale and the exemplary embodiments are not limited to the aspects presented. Rather, the emphasis is placed on the principles underlying the exemplary embodiments. In the drawings.

DETAILED DESCRIPTION

Figure 1:
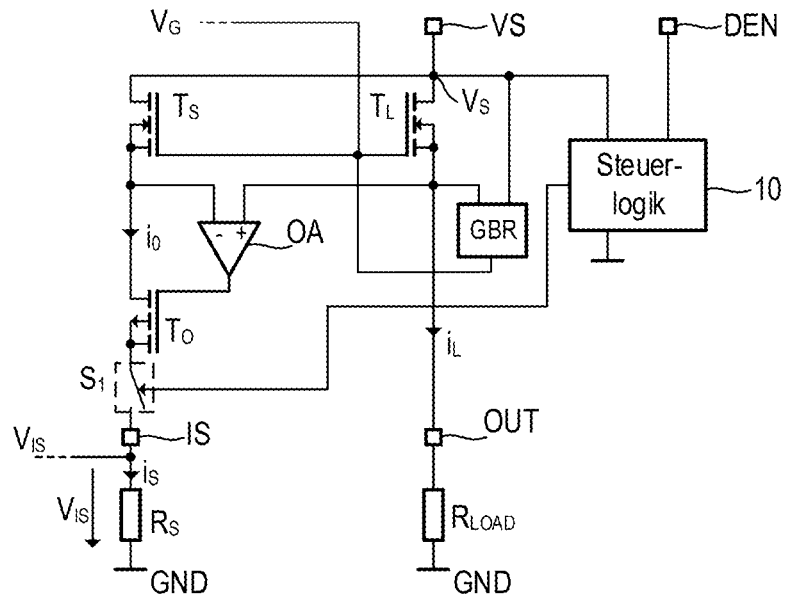
FIG. 1 illustrates an example of a current measuring circuit that uses a sense transistor to measure current.

FIG. 1 shows an exemplary implementation of a current measuring circuit with a sense transistor. In the example shown, an electrical load $R_{LOAD}$ is switched using a power transistor $T_L$. The current flowing through the power transistor $T_L$ and hence also through the load $R_{LOAD}$ is referred to as $i_L$. The power transistor $T_L$ is designed as a high-side switch. This means that the main current path of the power transistor $T_L$ (drain-source current path in the case of a MOS transistor) is connected between a supply terminal VS and an output (output pin OUT), to which the load $R_{LOAD}$ can be connected.

The load transistor $T_L$ is coupled to a current measuring circuit, which has a sense transistor $T_S$ coupled to the load transistor $T_L$. The current measuring circuit is designed to deliver a measuring current $i_0$ that represents a load current $i_L$ flowing through the load transistor $T_L$. As mentioned above, the measuring current $i_0$ is approximately proportional to the load current $i_L$, i.e. $i_0=i_L/K$ (proportionality factor K). For current measurement, the transistors $T_S$ and $T_L$ must have similar characteristics and operate (approximately) at the same operating point. Therefore, the gate electrodes and the drain electrodes of the two transistors $T_L$ and $T_S$ are connected together. In addition, the drain electrodes of the transistors $T_L$ and $T_S$ are connected to the supply terminal VS, to which a supply voltage $V_S$ is applied during operation. In order for both transistors $T_L$ and $T_S$ to operate at the same operating point, the drain-source voltages on both transistors $T_L$ and $T_S$ must also be equal. This is achieved with the help of the operational amplifier OA and the additional transistor $T_0$, which together ensure that the source voltage on the sense transistor $T_S$ is regulated to the same value as the source voltage on the load transistor $T_L$. This is only one example, however. The operational amplifier is not absolutely necessary. Other approaches are also known to ensure the (approximate) proportionality between the measuring current $i_0$ and load current $i_L$. The specific implementation will depend on the requirements of the application.

The sense transistor $T_S$ and the additional transistor $T_0$ are connected in series, i.e. their drain-source current paths are connected in series and the same measuring current $i_0$ flows through both transistors $T_S$ and $T_0$. In the example shown, the transistor $T_0$ is a p-channel transistor whereas the transistors $T_S$ and $T_L$ are n-channel transistors. The gate of transistor $T_0$ is controlled by the output signal of the operational amplifier OA, while the inputs of the operational amplifier OA are connected to the source electrodes of the transistors $T_S$ and $T_L$.

The operational amplifier OA has a feedback loop with the transistor $T_0$. The inverting input of the operational amplifier OA is connected to the source electrode of the sense transistor $T_S$, and the non-inverting input of the operational amplifier OA is connected to the source electrode of the power transistor $T_L$. If the source voltage on the sense transistor $T_S$ is less than the source voltage on the power transistor $T_L$, the voltage at the output of the operational amplifier amp OA then rises and thus the gate voltage on transistor $T_0$ increases, which causes the on resistance of the transistor $T_0$ to rise. The feedback loop of the operational amplifier OA is stable and hence the operational amplifier OA will drive the transistor $T_0$ in exactly such a way that the voltages at the source electrodes of the transistors $T_L$ and $T_S$ are substantially the same.

In the example shown, the measuring current $i_0$ is output at a sense pin IS. The output current is labeled in FIG. 1 as $i_S$ ($i_S=i_0$ in the example of FIG. 1). A measuring resistor $R_S$ can be connected to the sense pin IS. Normally, the measuring resistor $R_S$ is connected between the sense pin IS and a reference voltage (e.g. ground potential, 0 V). The resultant voltage $V_{IS}$ at the sense pin IS is then equal to the product of the measuring current $i_S$ and resistance $R_S$ ($V_{IS}=R_S \cdot i_S=i_L \cdot R_S/K$). In the example shown, the output of the current $i_S$ at the sense pin IS can be enabled and disabled using the electronic switch $S_1$. The control logic 10 can switch the switch $S_1$ on and off, for example in accordance with a signal received at a diagnostic pin DEN. In other implementations, the control logic 10 can communicate with other components via other communication links, such as a serial bus.

Experiments have shown that as the drain-source voltages on the transistors $T_L$, $T_S$ (which occur at low load current) decrease, the proportionality factor K increasingly deviates from its nominal value, causing measurement errors. A well-known approach to improving this situation is to set a lower limit on the drain-source voltage on the power transistor $T_L$ and to set the gate voltage such that the drain-source voltage does not fall below a minimum value. Such a concept is known as gate-back regulation (see FIG. 1, function block GBR).

Gate-back regulation causes the gate voltage to be reduced at very low load currents (and consequently low drain-source voltage on transistor $T_L$) in order to increase the on resistance $R_{ON}$ of the transistor. However, the latter has the effect that if the load current increases abruptly (e.g. when the load exits a standby mode) the voltage on the load can break down. Such an undervoltage event can lead to an unwanted shutdown or other faults in the load.

Figure 2:
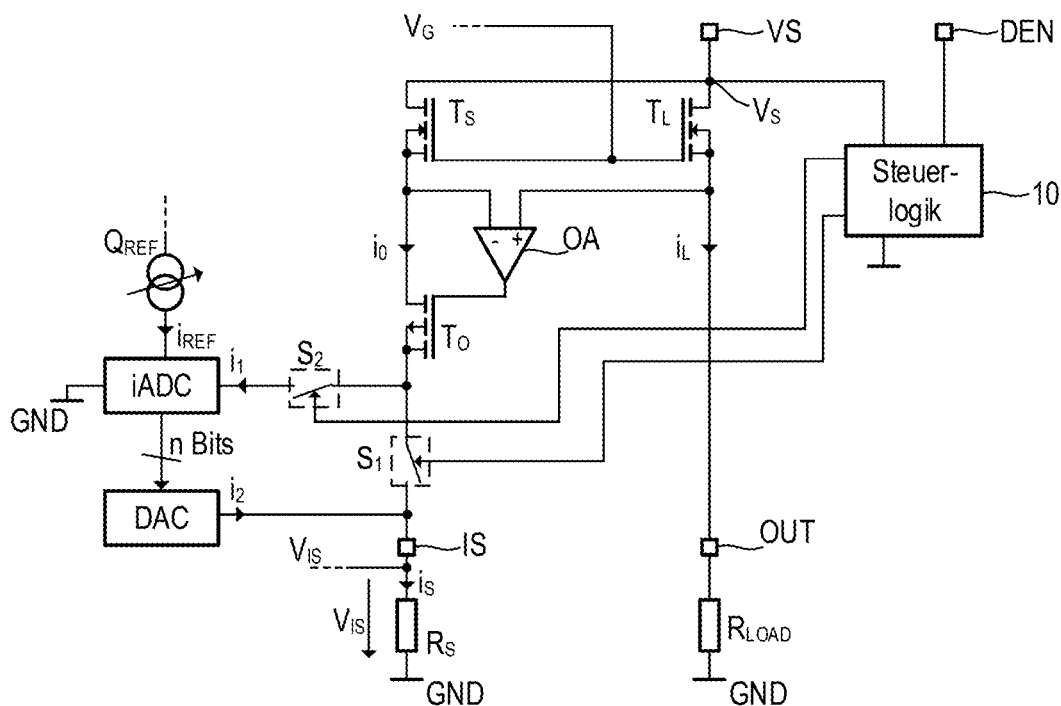
FIG. 2 illustrates a current measuring circuit with a sense transistor according to an exemplary embodiment that is better suited to small currents than the circuit in FIG. 1.

The example from FIG. 2 can be considered an improvement to the circuit from FIG. 1, since the gate-back regulation is also omitted and the problems associated with it cannot occur. For very low load current values, the current measurement can be performed using the analog-to-digital converter iADC and the digital-to-analog converter DAC. These are switched by the control logic between the transistor $T_0$ and the sense pin IS by means of switches $S_1$ and $S_2$. The other components (transistors $T_L$, $T_S$, operational amplifier amp OA, transistor $T_0$) are the same as in FIG. 1 and reference is made to the corresponding description above.

In the example shown, the control logic can operate the circuit in three different modes, which can be selected, for example, based on a diagnostic signal received at a diagnostic pin DEN. The control logic is designed to use the switches S1 and S2 to configure the current measuring circuit so that the measuring current $i_0$ is output at the sense pin IS in a first mode. In this mode, the switch $S_1$ is closed (ON) and switch $S_2$ is open (OFF). In this mode, the circuit operates essentially as the circuit from FIG. 1.

The current measurement circuit can also be configured to redirect the measuring current $i_0$ to the current input of the analog-to-digital converter iADC in a second mode. In this case, the input current $i_1$ of the analog-to-digital converter iADC corresponds to the current $i_0$. The analog-to-digital converter iADC generates a digital value that represents the measuring current $i_0$. This digital value is fed to the digital-to-analog converter DAC, which again generates an analog output current $i_2$, based on the digital value, which represents the digital value. This output current $i_2$ is output at the sense pin IS (instead of the current $i_0$). To ensure this, the switch $S_1$ is closed and the switch $S_2$ is open. In a third mode, both switches are open and the current output at the sense pin IS is blocked, i.e. no current is output.

The second mode is particularly suitable for measuring very low load currents $i_L$. Any deviations between the actual proportionality factor $K=i_L/i_0$ and the ideal/nominal factor can be calibrated by adjusting/fine tuning the reference current $i_{REF}$ (controllable current source $Q_{REF}$) which is used by the analog-to-digital converter iADC. The output current range of the DAC (output current $i_2$) can be significantly greater than the input current range of the iADC (input current $i_1$). This means that together the analog-to-digital converter iADC and the digital-to-analog converter DAC have a gain $i_2/i_1$ which can be significantly greater than one (e.g. $i_2/i_1=100$).

In some exemplary embodiments, the control logic can also be used to implement a fourth operating mode, in which a defined constant current is output at the sense pin IS. For this purpose, the control logic can open switches $S_1$ and $S_2$, for example. Thus the input current $i_1$ of the analog-to-digital converter iADC is zero. At the same time, however, a digital input signal (which can be generated by the control logic, for example) is fed to the DAC, which results in the desired constant current $i_2$ which is output at the pin IS. The constant current can help a user to determine a possible error (due to tolerances) in the resistance value $R_S$.

The operating mode can be selected by the control logic based on a diagnostic signal that can be received at the diagnostic pin DEN or—in some exemplary embodiments—via any other communication link from an external controller. Suitable communication links can be, for example, serial data lines, such as those provided by an SPI bus (SPI=Serial Peripheral Interface). In the example shown, the third operating mode is selected when the diagnostic signal at the pin DEN is at a low level. In this case, the current output at pin IS is zero ($i_S$=0). The first operating mode is selected when the diagnostic signal at the pin DEN has a constant high level. In this case, the current output at pin IS is equal to the measuring current $i_0$ ($i_S$=$i_0$). The second operating mode (Low Current Mode) is selected when the diagnostic signal at the pin DEN switches between the low and high levels with a first specified first frequency $f_0$. In this case, the current output at pin IS is equal to the output current $i_2$ of the DAC ($i_S$=$i_2$) and this represents the measuring current $i_1$=$i_0$. The fourth operating mode can be selected when the diagnostic signal at the pin DEN switches between the low and high levels with a first specified second frequency $f_1$.

Figure 3:
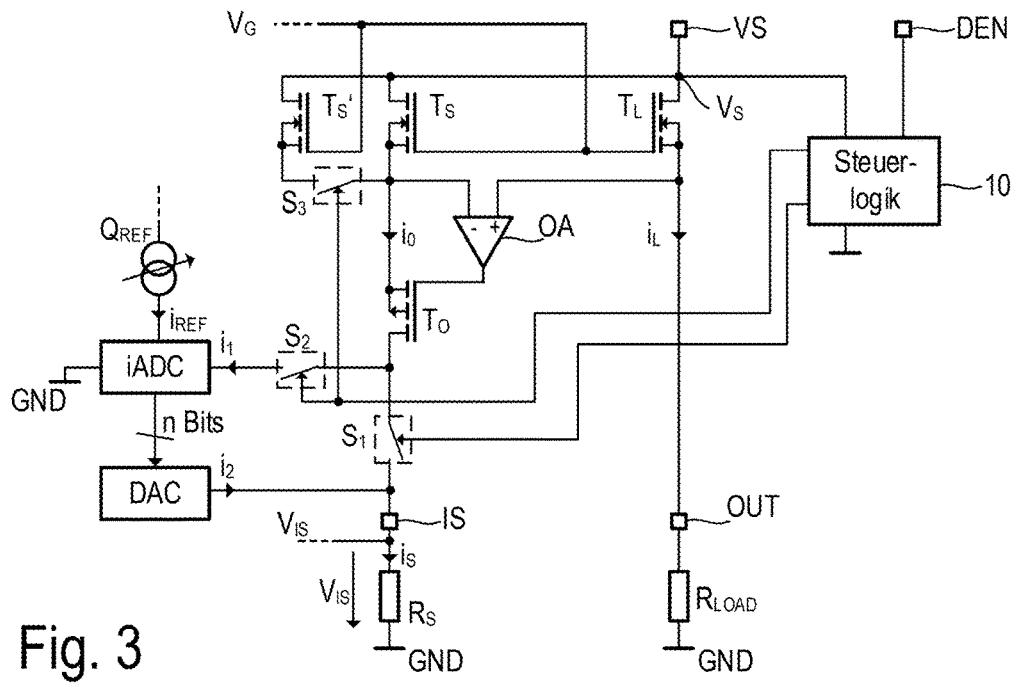
FIG. 3 illustrates a modification of the circuit in FIG. 2.

FIG. 3 illustrates a modification of the circuit of FIG. 2. The main difference from the previous example is that in the second mode (Low Current Mode), the proportionality factor K between load current $i_L$ and measuring current $i_0$ is also modified. As mentioned above, the proportionality factor K is—at least theoretically—equal to the ratio $i_L/i_0$ as well as being equal to the ratio $A_{TL}/A_{TS}$, where $A_{TL}$ denotes the active surface area of the power transistor $T_L$ and $A_{TS}$ denotes the active surface area of the sense transistor $T_S$. The ratio $A_{TL}/A_{TS}$ of the active surface areas is equal to the ratio $N_{TL}/N_{TS}$ of the transistor cells forming the power transistors $T_L$ ($N_{TL}$ cells) and the sense transistors $T_S$ ($N_{TS}$ cells) (provided that all cells are of the same size, which is usually the case).

In the example shown in FIG. 3, the control logic can increase the active surface area of the sense transistor by adding, for example, previously unused transistor cells to the sense transistor $T_S$. This concept is symbolized in FIG. 3 by the additional sense transistor $T_S'$, which is connected in parallel with the sense transistor $T_S$ with the switch $S_3$ closed ($S_3$ on) and is inactive with the switch $S_3$ open ($S_3$ off). The transistors $T_S$ and $T_S'$ can therefore be understood as a single sense transistor, the number of cells of which can be increased from $N_{TS}$ to $N_{TS}+N_{TS}'$. As a result, by connecting the additional transistor cells, the proportionality factor changes from $N_{TL}/N_{TS}$ to $N_{TL}/(N_{TS}+N_{TS}')$. For example, for $N_{TL}$=10,000, $N_{TS}$=1 and $N_{TS}'$=9, the proportionality factor can be reduced from K=10,000 to K=1000. In this example, with constant load current $i_L$, the larger number $N_{TS}+N_{TS}'$ of transistor cells in the sense transistor increases the measuring current $i_0$ by a factor of ten.

In the example shown in FIG. 3, the switches $S_3$ and $S_2$ are switched simultaneously. This means that the switch $S_3$ is on in the second mode (Low Current Mode), which increases the active area of the sense transistor $T_S+T_S'$, and off in the other modes. In other exemplary embodiments, another mode can also be implemented in which switches $S_1$ and $S_3$ are on and the switch $S_2$ is off. In this case, the measuring current $i_0$ is output at pin IS, wherein due to the enlarged sense transistor the proportionality factor is correspondingly smaller. Incidentally, the example of FIG. 3 is the same as the example of FIG. 2 and reference is made to the associated description above.

Figure 4:
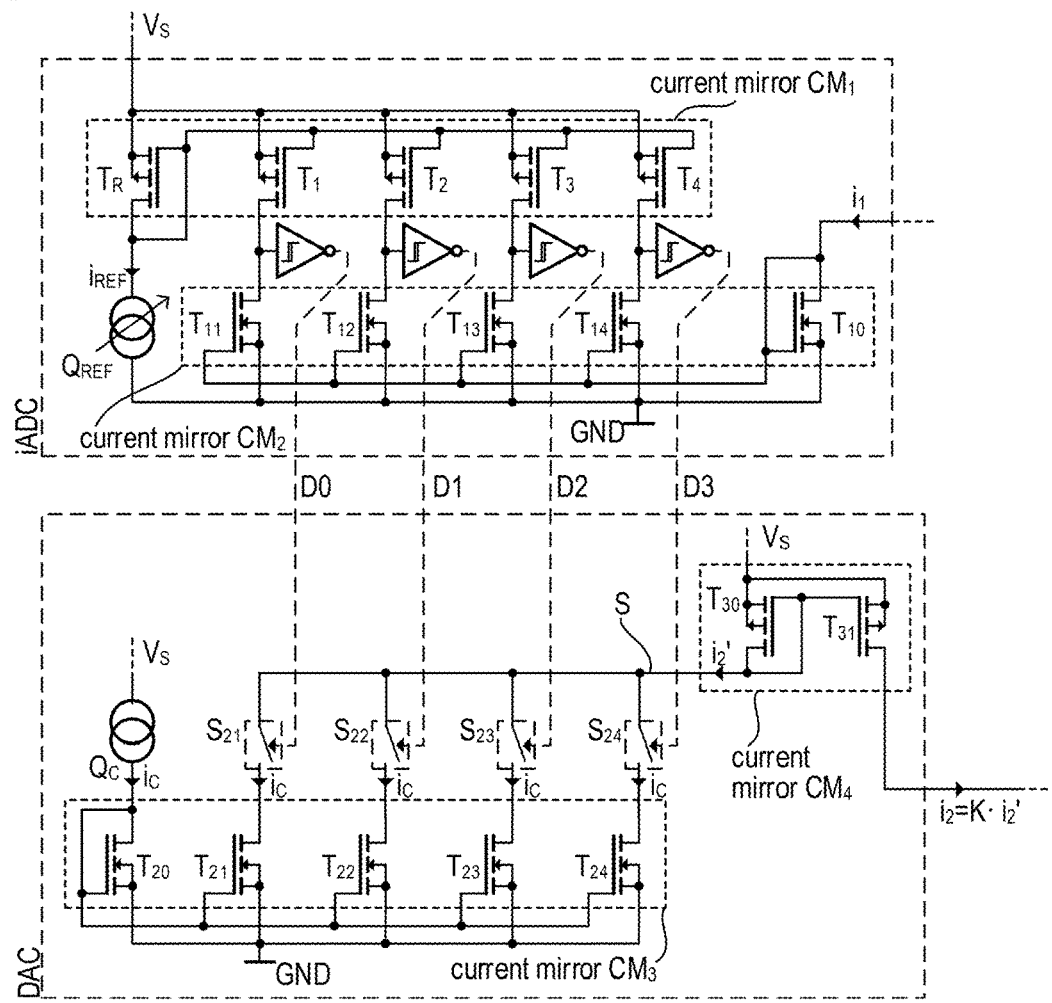
FIG. 4 illustrates an exemplary implementation of the analog-to-digital converter and the digital-to-analog converter in the examples shown in FIGS. 3 and 4.

FIG. 4 shows examples of possible implementations of the analog-to-digital converter iADC and the digital-to-analog converter DAC. In the example shown, the analog-to-digital converter iADC is a 2-bit parallel converter (flash converter, direct-conversion converter) with current input (input current $i_1$, see FIG. 2). In other exemplary embodiments, an analog-to-digital converter with a higher resolution (e.g. 8 or 12 bits) can also be used. In addition, other analog-to-digital conversion principles (e.g. successive approximation, dual-slope procedure, etc.) can also be used.

According to FIG. 4, the analog-to-digital converter iADC comprises a first current mirror CM1 and a second current mirror CM2, as well as the controllable reference current source $Q_{REF}$, which provides the reference current $i_{REF}$. This reference current $i_{REF}$ is supplied to the input branch (transistor $T_R$) of the current mirror CM1 and this reference current $i_{REF}$ is "mirrored" with a different scaling (mirror ratio) to the four output branches (transistors $T_1$-$T_4$) of the current mirror CM1 ($2^b$ output branches for b bits resolution). The scaled reference currents in the four output branches of the current mirror $CM_1$ can be, for example, 5 μA, 14 μA, 23 μA and 36 μA. The numerical values are of course to be understood only as examples and can be dimensioned differently depending on the application. In the example discussed here, these scaled reference currents are a linearly increasing sequence of currents in order to obtain a linear characteristic of the analog-to-digital converter.

The second current mirror CM2 is designed to mirror the input current $i_1$ from the input branch (transistor $T_{10}$) into the four output branches (transistors $T_{11}$-$T_{14}$). In the example discussed here, the scaling (mirror ratio) in the current mirror CM2 is the same for each output branch. The transistors of the first current mirror CM1 are high-side transistors (e.g. p-channel MOSFETs) and the transistors of the second current mirror CM2 are low-side transistors (e.g. n-channel MOSFETs). The output branches of the first current mirror CM1 are connected to the corresponding output branches of the second current mirror, and the input of a comparator is connected to the common circuit node in each case. The comparators indicate whether the voltage at the common circuit nodes of the two current mirrors is high or low. The above-mentioned sequence of reference currents (e.g. 5 μA, 14 μA, 23 μA and 36 μA) can be seen as a sequence of threshold values. Essentially, the two current mirrors CM1 and CM2 together form four current comparators, wherein the threshold values can be adjusted by fine-tuning the reference current $i_{REF}$.

The $2^b$ binary output signals D0, D1, D2, D3 of the comparators represent the input current $i_1$ and could theoretically be converted into a b-bit digital value, but this is not necessary. The output signals D0-D3 are respectively "1" (high level) if the input current $i_1$ reflected in the respective output branch of the current mirror CM2 is greater than the associated threshold value (e.g. 5 μA, 14 μA, 23 μA and 36 μA) specified by the reference current $i_{REF}$, and "0" otherwise (in this example, the comparators have an inverting characteristic).

The digital-to-analog converter DAC also has two current mirrors, namely the third current mirror CM3 and the fourth current mirror CM4. A further current source $Q_C$ generates a constant current $i_C$ (e.g. $i_C$=10 μA), which is fed to the input branch (transistor $T_{20}$) of the current mirror CM3 and mirrored in the four output branches (transistor $T_{21}$-$T_{24}$) (in each case with a scaling (mirror ratio) of one). The output branches of the current mirror CM3 can be activated and interrupted (deactivated) using switch $S_{21}$ to $S_{24}$ depending on the logic level of the signals D0-D3. For currents $i_C$ all active output branches in the circuit node S add up to the current $i_2'$. In the example mentioned above ($i_C$=10 µA), the current $i_2'$ can assume the values 0 µA, 10 µA, 20 µA, 30 µA and 40 µA.

Due to the current mirror CM4 (transistors $T_{30}$ and $T_{31}$) the current $i_2$ is further amplified by a factor G (mirror ratio G in the current mirror CM4). In the factor shown here, the factor G is e.g. 100. The output current $i_2$=G·$i_2'$ of the current mirror CM4 is also the output current of the DAC.

Figure 5:
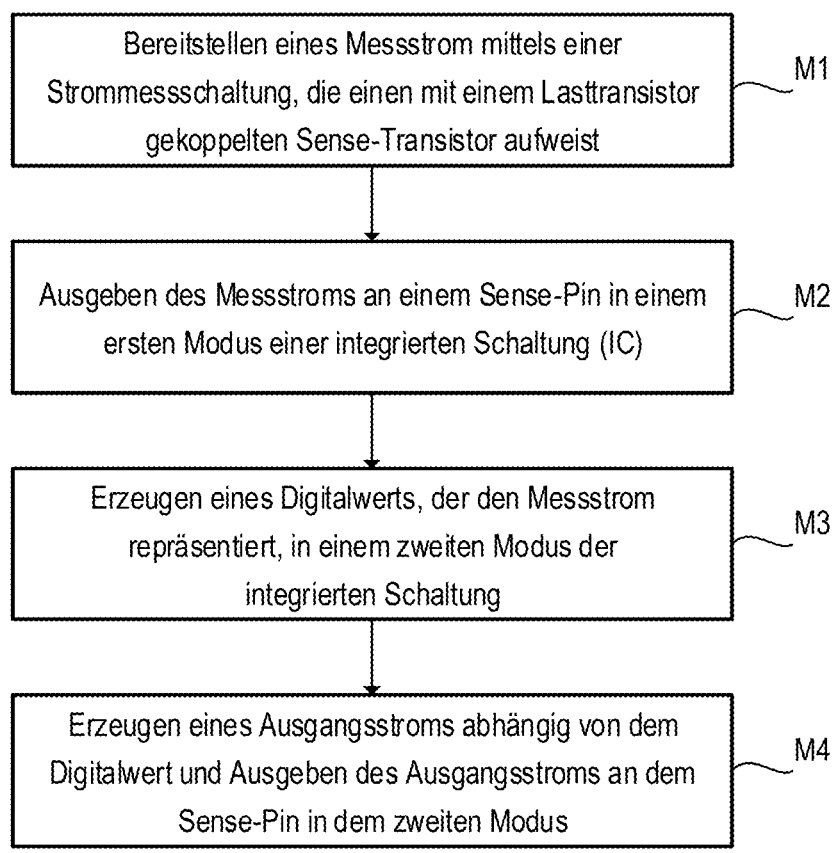
FIG. 5 is a flowchart to illustrate an example of a current measuring method that can be carried out with the circuit from FIGS. 2 and 3.

FIG. 5 contains a flowchart illustrating an example of a method for current measurement that can be carried out using the circuit described above. According to FIG. 5, the method comprises providing a measuring current (see FIG. 5, step M1) by means of a current measuring circuit which has a sense transistor coupled to a load transistor (see e.g. FIGS. 2 and 3, current $i_0$, sense transistor $T_S$). The method comprises outputting the measured current at a sense pin in a first mode of an integrated circuit (see FIG. 5, step M2), which contains the load transistor and the sense transistor, and generating a digital value representing the measuring current in a second mode of the integrated circuit. This mode can be particularly suitable for measuring small currents. Finally, the method includes generating an output current (see FIGS. 2 and 3, current $i_2$) depending on the digital value and outputting the output current at the sense pin in the second mode of the integrated circuit.

According to an exemplary embodiment, a diagnostic signal can be received at a diagnostic pin (see e.g. FIG. 2, pin DEN). The operating modes can be selected depending on the diagnostic signal. For example, the integrated circuit can switch to the first or second mode (depending on the implementation, also to the third or fourth mode) according to a level or a modulation frequency (or other modulation parameter) of the diagnostic signal.

To calibrate the current measurement in the second operating mode, both the load current $i_L$ of the load transistor can be measured in an end-of-line test, for example, and the output current $i_2$ output in the second mode can be measured. The output current $i_2$ can be adjusted based on the measured load current. This adjustment of the output current $i_2$ can be carried out by calibrating the reference current $i_{REF}$ of the analog-to-digital converter iADC that generates the digital value (see FIGS. 3 and 4, current source $Q_{REF}$).

The invention claimed is:

1. A circuit comprising:
a load transistor including a main current path, wherein the load transistor is connected between a first supply node and an output pin for connecting a load;
a current measuring circuit coupled to the load transistor, wherein the current measuring circuit includes a sense transistor coupled to the load transistor, wherein the current measuring circuit is configured to supply a measuring current that represents a load current flowing through the load transistor;
an analog-to-digital converter including a current input, wherein the analog-to-digital converter is configured to output a digital signal that represents an input current of the analog-to-digital converter;
a digital-to-analog converter configured to output an output current that depends on the digital signal; and
a control circuit configured to, using switches, and in response to a control signal, select among two or more modes of operation, wherein:
in a first mode, the control circuit is configured to control the switches to output the measuring current at a sense pin, and
in a second mode, the control circuit is configured to control the switches to feed the measuring current as an input current to the analog-to-digital converter and output the output current of the digital-to-analog converter at the sense pin.

2. The circuit of claim 1, further comprising:
a current source configured to provide a reference current for the analog-to-digital converter.

3. The circuit of claim 1,
wherein the control signal comprises a diagnostic signal received at a diagnostic pin.

4. The circuit of claim 1,
wherein the control signal comprises a diagnostic signal received from an external controller via a communication link.

5. The circuit of claim 1,
wherein in response to the control signal, in a third mode, the control circuit is configured to control the switches to block output of a sensed current at the sense pin.

6. The circuit of claim 5,
wherein in response to the control signal, in a fourth mode, the control circuit is configured to control the switches to output a defined constant current independent of the load current at the sense pin.

7. The circuit of claim 1,
wherein the sense transistor comprises one or more transistor cells and wherein the control circuit is configured to change a number of transistor cells of the sense transistor using the switches.

8. The circuit of claim 7,
wherein in the second operating mode, the sense transistor has more active transistor cells than in the first operating mode.

9. A method comprising:
providing a measuring current using a current measuring circuit that includes a sense transistor coupled to a load transistor;
outputting the measuring current at a sense pin in response to a control signal selecting a first mode of an integrated circuit that includes the load transistor and the sense transistor;
generating a digital value representing the measuring current in response to the control signal selecting a second mode of the integrated circuit; and
generating an output current depending on the digital value and outputting the output current at a sense pin in response to the control signal selecting in the second mode of the integrated circuit.

10. The method of claim 9, wherein the control signal comprises a diagnostic signal, the method further comprising:
receiving the diagnostic signal at a diagnostic pin; and
changing to the first mode or the second mode depending on the diagnostic signal.

11. The method of claim 9, further comprising:
measuring a load current of the load transistor in an end-of-line test;
measuring the output current output in the second mode; and
adjusting the output current based on the measured load current.

12. The method of claim 11,
wherein the output current is adjusted by calibrating a reference current of an analog-to-digital converter that generates the digital value.

* * * * *